(12) United States Patent
Otoma

(10) Patent No.: US 7,305,018 B2
(45) Date of Patent: Dec. 4, 2007

(54) SURFACE-EMITTING SEMICONDUCTOR LASER ARRAY AND OPTICAL TRANSMISSION SYSTEM USING THE SAME

(75) Inventor: Hiromi Otoma, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 194 days.

(21) Appl. No.: 11/319,393

(22) Filed: Dec. 29, 2005

(65) Prior Publication Data

US 2006/0285567 A1 Dec. 21, 2006

(30) Foreign Application Priority Data

Jun. 20, 2005 (JP) ............................. 2005-179402

(51) Int. Cl.
*H01S 5/00* (2006.01)
(52) U.S. Cl. .................................. 372/50.1; 372/43.01
(58) Field of Classification Search ............... 372/50.1, 372/43.01, 45.01; 359/344
See application file for complete search history.

(56) References Cited

U.S. PATENT DOCUMENTS 5,386,139 A * 1/1995 Idei et al. ................... 257/466
5,468,656 A * 11/1995 Shieh et al. ................... 438/32
5,990,499 A * 11/1999 Kuhlmann et al. ........... 257/99
6,185,240 B1 * 2/2001 Jiang et al. ............ 372/50.124

FOREIGN PATENT DOCUMENTS

JP      A 2000-216442      8/2000

* cited by examiner

*Primary Examiner*—Minsun Oh Harvey
*Assistant Examiner*—Tuan N. Nguyen
(74) *Attorney, Agent, or Firm*—Oliff & Berridge, PLC

(57) ABSTRACT

A surface emitting semiconductor laser includes a substrate, at least one light-emitting element on the substrate, and at least one protection element on the substrate. The light-emitting element includes a first semiconductor layer of a first conduction type electrically connected to a first electrode, and a second semiconductor layer of a second conduction type electrically connected to a second electrode. The protection element includes a third semiconductor layer of the first conduction type electrically connected to a third electrode, and a fourth semiconductor layer of the second conduction type electrically connected to the second electrode. The first semiconductor layer and the first electrode are electrically isolated from the third semiconductor layer and the third electrode by insulation means.

19 Claims, 10 Drawing Sheets

1 VCSEL

SURFACE-EMITTING SEMICONDUCTOR LASER ARRAY AND OPTICAL TRANSMISSION SYSTEM USING THE SAME

BACKGROUND OF THE INVENTION

1. Field of the Invention

The present invention relates to a surface-emitting semiconductor laser, and more particularly, to a vertical-cavity surface-emitting laser diode (hereinafter referred to as VCSEL) having a mechanism for protecting the VCSEL from electrostatic discharge damage.

2. Description of the Related Art

The VCSEL emits light from the front surface of a semiconductor substrate, and several features such as low driving current, testing on the wafer level and easy mounting, as compared to the edge-emitting semiconductor laser. The VCSEL is utilized as various light sources such as a light source in optical information processing and optical communications and a light source for data storage.

A high voltage such as static electricity may be applied to the VCSEL at the time of mounting the VCSEL on a circuit board, as in the case of other types of semiconductor devices. When electrostatic discharge (hereinafter simply referred to as ESD) occurs within the device, large spike current flows instantaneously and may destroy or deteriorate the device. ESD may be a cause that malfunctions the device. Some reports directed to coping with ESD have been known.

Japanese Patent Application Publication No. 2000-216442 (Document 1) discloses a semiconductor light-emitting device having a semiconductor light-emitting element such as an LED, a first lead connected to the cathode electrode of the element, a second lead connected to the anode electrode of the element, and an electrostatic discharge damage preventing element electrically connected between the first and second leads such as a constant-voltage diode, these components being integrally sealed with resin.

U.S. Pat. No. 6,185,240 (Document 2) discloses an arrangement in which a diode against ESD and VCSEL are integrated on a single chip. A trench is formed in the substrate of the chip in order to define a diode region. The diode is preferably a p-i-n diode and has a breakdown voltage of 10-20 V.

The semiconductor light-emitting device disclosed in Document 1 is designed to separately have the semiconductor light-emitting element and the ESD preventing element. Thus, when the light-emitting element is solely handled, sufficient ESD protection may not be obtained. In addition, the device needs a fabrication step of mounting the element for preventing the electrostatic discharge damage, which increases the cost.

The VCSEL disclosed in Document 2 desired ESD protection because the VCSEL and the protection diode are integrated on the chip. However, part of the VCSEL is connected in parallel with the remaining VCSEL in the reverse direction in order to define the ESD protection diode, which needs multiple trenches in the substrate. This brings about a complicated structure.

Yet another ESD protection uses a dummy element connected in parallel to the VCSEL on the identical chip in order to improve the ESD breakdown voltage, as proposed by the same assignee as that of the present application. However, the proposed ESD protection allows drive current to flow through the dummy element and consumes a large amount of power. In addition, the measurement has a relative large electrostatic capacitance, which degrades responsiveness.

SUMMARY OF THE INVENTION

The present invention has been made in view of the above circumstances and provides a surface-emitting semiconductor laser diode.

According to an aspect of the present invention, there is provided a surface emitting semiconductor laser comprising: a substrate; at least one light-emitting element on the substrate; and at least one protection element on the substrate, the light-emitting element including a first semiconductor layer of a first conduction type electrically connected to a first electrode, and a second semiconductor layer of a second conduction type electrically connected to a second electrode, the protection element including a third semiconductor layer of the first conduction type electrically connected to a third electrode, and a fourth semiconductor layer of the second conduction type electrically connected to the second electrode, the first semiconductor layer and the first electrode being electrically isolated from the third semiconductor layer and the third electrode by insulation means.

According to another aspect of the present invention, there is provided a module comprising: a surface-emitting semiconductor laser and a package housing the surface-emitting semiconductor laser; the surface-emitting semiconductor laser including: a substrate; at least one light-emitting element on the substrate; and at least one protection element on the substrate, the light-emitting element including a first semiconductor layer of a first conduction type electrically connected to a first electrode, and a second semiconductor layer of a second conduction type electrically connected to a second electrode, the protection element including a third semiconductor layer of the first conduction type electrically connected to a third electrode, and a fourth semiconductor layer of the second conduction type electrically connected to the second electrode, the first semiconductor layer and the first electrode being electrically isolated from the third semiconductor layer and the third electrode by insulation means.

According to yet another aspect of the present invention, there is provided an optical communication apparatus comprising: a surface-emitting semiconductor laser; a package housing the surface-emitting semiconductor laser; and a transmission unit transmitting laser light emitted from the surface emitting semiconductor laser, the surface emitting semiconductor laser including: a substrate; at least one light-emitting element on the substrate; and at least one protection element on the substrate, the light-emitting element including a first semiconductor layer of a first conduction type electrically connected to a first electrode, and a second semiconductor layer of a second conduction type electrically connected to a second electrode, the protection element including a third semiconductor layer of the first conduction type electrically connected to a third electrode, and a fourth semiconductor layer of the second conduction type electrically connected to the second electrode, the first semiconductor layer and the first electrode being electrically isolated from the third semiconductor layer and the third electrode by insulation means.

According to a further aspect of the present invention, there is provided an optical communication system comprising: a surface-emitting semiconductor laser; a package housing the surface-emitting semiconductor laser; and a transmission unit transmitting laser light emitted from the surface emitting semiconductor laser, the surface emitting semiconductor laser including: a substrate; at least one light-emitting element on the substrate; and at least one protection element on the substrate, the light-emitting element including a first semiconductor layer of a first conduction type electrically connected to a first electrode, and a second semiconductor layer of a second conduction type electrically connected to a second electrode, the protection element including a third semiconductor layer of the first conduction type electrically connected to a third electrode, and a fourth semiconductor layer of the second conduction type electrically connected to the second electrode, the first semiconductor layer and the first electrode being electrically isolated from the third semiconductor layer and the third electrode by insulation means.

BRIEF DESCRIPTION OF THE DRAWINGS

Preferred embodiments of the present invention will be described in detail based on the following figures, wherein.

DESCRIPTION OF THE PREFERRED EMBODIMENTS

A description will now be given, with reference to the accompanying drawings, of VCSELs in accordance with embodiments of the present invention.

Figure 1A:
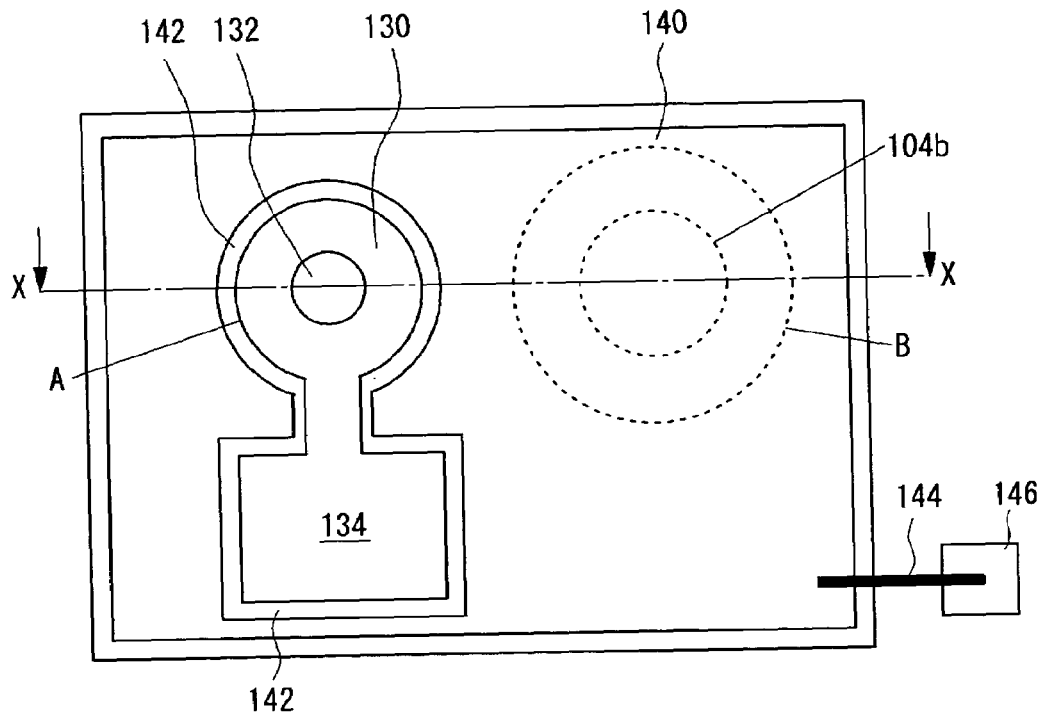
FIG. 1A is a plan view of a VCSEL in accordance with a first embodiment of the present invention.
Figure 1B:
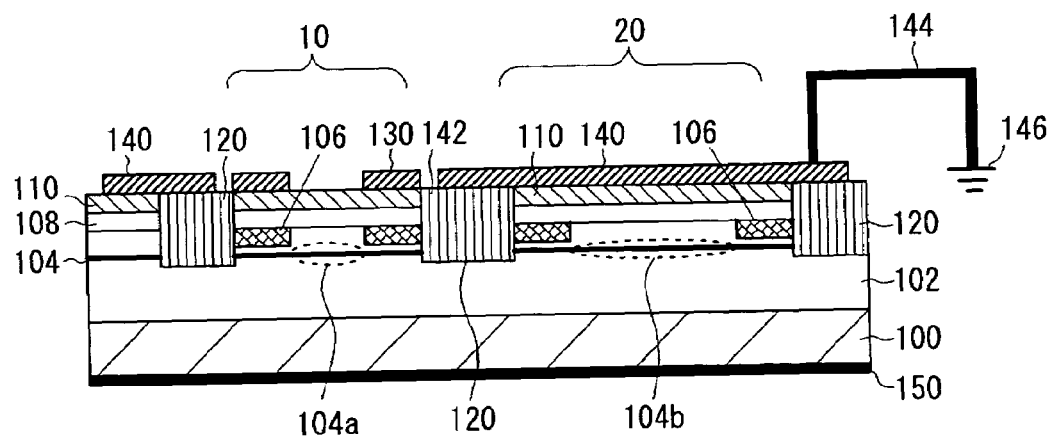
FIG. 1B is a cross-sectional view taken along a line X-X shown in FIG. 1A.

FIGS. 1A and 1B schematically show a VCSEL in accordance with an embodiment of the present invention. More specifically, FIG. 1A is a plan view of the VCSEL, and FIG. 1B is a cross-sectional view taken along a line X-X shown in FIG. 1A. A VCSEL 1 has a substrate 100 on which a light-emitting portion 10 and a dummy portion 20 are formed. Multiple light-emitting portions 10 and multiple dummy portions 20 may be formed on the substrate. FIGS. 1A and 1B show an exemplary structure having the single light-emitting portion 10 and the single dummy portion 20.

The substrate 100 may be an n-type GaAs substrate on which there are provided an n-type lower semiconductor multilayer reflection mirror 102, an active layer 104, a current confinement layer 106, a p-type upper semiconductor multilayer reflection mirror 108, a p-type contact layer 110, an insulating portion 120 that functions as an insulation means and insulates the light-emitting portion 10 and the dummy portion 20 from each other, an upper electrode 130 for the light-emitting portion 10, an upper electrode 140 for the dummy portion 20, and a lower common electrode 150 provided on the backside of the substrate 100.

The insulating portion 120 forms an insulating region for defining an operating region of the light-emitting portion 10. The insulating region extends from the contact layer 110 to the active layer 104 or a part of the lower reflection mirror 102. The insulating region defines an operating region A of the light-emitting portion 10 and an operating region B of the dummy portion 20 surrounded by the insulating portion 120. The operating regions A and B are not limited to specific shapes, but may have a cylindrical shape defined by the insulating portion 120. The insulating portion 120 may be formed by etching the semiconductor layers on the substrate 100, so that the operating regions A and B can be defined. The etching depth reaches the active layer 104 or part of the lower reflection mirror 102. An appropriate ion such as proton may be implanted around the cylindrical operating regions A and B, so that an ion implanted region has a high resistance.

Even in the dummy portion 20, an insulating region is formed so as to extend from the contact layer 110 to the active layer or part of the n-type reflection mirror 102. The insulating region defines the operating region B for dummy surrounded by the insulating portion 120. The dummy region B for the dummy portion 20 is greater than the operating region A of the light-emitting portion 10.

A current confinement layer 106 is formed on the active layer 104 surrounded by the insulating portion 120. The current confinement layer 106 may be defined by oxidizing a part of a semiconductor layer containing aluminum (Al) or implanting an impurity. Preferably, the area of the active layer 104 defined by the current confinement layer 106 in the dummy portion 20 is greater than that in the light-emitting portion 10. For instance, for the current confinement layer 106 formed by the oxidized layer, the light-emitting portion 10 and the dummy portion 20 have the oxidized layers of an identical size, so that an active region 104a in the light-emitting portion 10 can be greater than an active region 104b in the dummy portion 20. This results in the active region 104 having a lower resistance than the active region 104a.

The upper electrode 130 in the light-emitting portion 10 is in ohmic contact with the contact layer 110, and functions as an anode of the portion 10. The upper electrode 130 has an aperture 132 for emitting laser from the active region 104a in the light-emitting portion 10. The upper electrode 130 is connected to a bonding part 134 underlain by an insulating film. The upper electrode 140 in the dummy portion 20 is in ohmic contact with the contact layer 110 provided therein. The dummy portion 20 is not needed to emit light, so that no aperture for light emission is formed in the upper electrode 140. The dummy electrode 140 is isolated from the upper electrode 130 by a gap 142 formed around the upper electrode 130. The upper electrode 140 is connected to a ground potential 146 serving as a reference potential via a bonding wire 144 of gold or the like.

Figure 2:
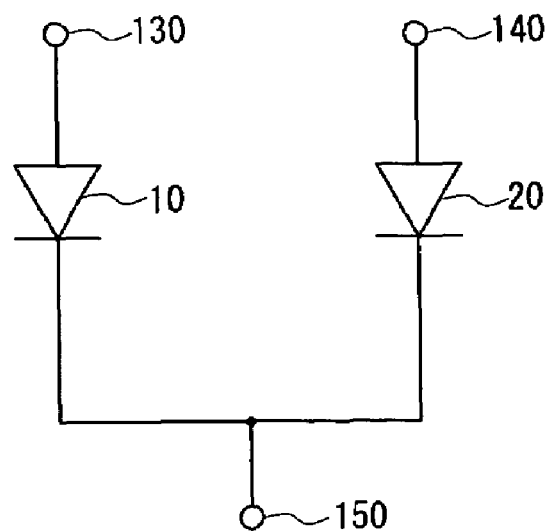
FIG. 2 is a circuit diagram of the VCSEL shown in FIGS. 1A and 1B.

FIG. 2 is a circuit diagram of the VCSEL shown in FIGS. 1A and 1B. The cathodes of the light-emitting portion 10 and the dummy portion 20 are connected to the lower common electrode 150. The anode of the light-emitting portion 10 is connected to the upper electrode 130, and the anode of the dummy portion 20 is connected to the upper electrode 140.

In normal operation of the VCSEL, that is, when the VCSEL emits light, a forward voltage is applied between the upper electrode 130 and the lower electrode 150. A driving current flows to the active region 104a of the light-emitting portion 10 from the bonding pad 134 or the upper electrode 130. Laser light generated in the active region 104a is emitted from the aperture 132 in the upper electrode 130 in the direction perpendicular to the substrate 100. The upper electrode 140 of the dummy portion 20 is isolated from the upper electrode in the light-emitting portion 10, so that no driving current flows through the active region 104b. With the above structure, the present VCSEL exhibits the same performance as VCSEL without any dummy portion. The performance of VCSEL may be described by the threshold current value and the driving current value. In addition, the present VCSEL has a restrained static capacitance.

When a large negative static voltage is applied to the lower common electrode 150 on the cathode side, electrostatic current or surge current flows through the dummy portion 20 of the active region 104b having a large area and a lower resistance. It is thus possible to prevent large discharge current from through the active region 104a. When a large positive static voltage is applied to the lower common electrode 150, the light-emitting portion 10 and the dummy portion 20 are reverse-biased. The dummy portion 20 has the larger area of the active region 104b has a lower breakdown voltage than the light-emitting portion 10. Thus, surge current from the lower common electrode 150 mainly passes through the dummy portion 20 and flows to the upper electrode 140 or the ground potential 146. Thus, the light-emitting portion 20 can be protected. The resistance to ESD can be improved, particularly, for a specific situation in which the cathode (the lower common electrode) is not grounded.

Further, in the present VCSEL, the area of the upper electrode 140 in the dummy portion 20 is greater than that of the upper electrode in the light-emitting portion 10. This makes it easy for electrostatic discharge flying above the chip to be captured by the larger upper electrode 140. That is, electrostatic discharge can be captured with a higher probability based on the larger area. Thus, the charge captured by the upper electrode 140 can be caused to flow to the ground potential 146 without flowing to the light-emitting portion 10.

Figure 3:
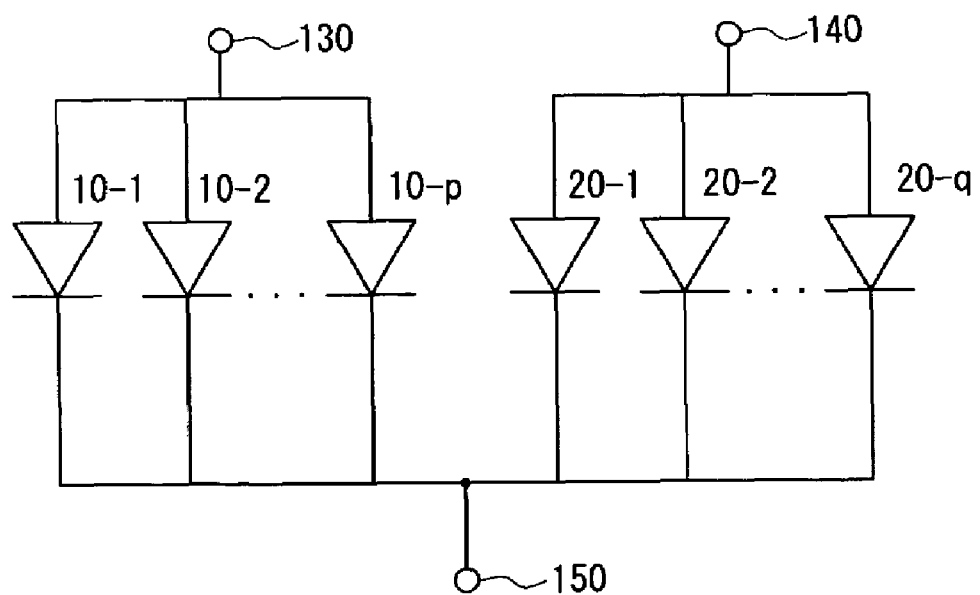
FIG. 3 is a circuit diagram of a variation of the VCSEL shown in FIGS. 1A and 1B.

In the foregoing, the VCSEL has the combination of the single light-emitting portion 10 and the single dummy portion 20. Alternatively, as shown in FIG. 3, the VCSEL in accordance with the present embodiment may have multiple light-emitting portions 10-1 through 10-p and multiple dummy portions 20-1 through 20-q (p and q are respectively natural numbers) on the identical (single) substrate. The anodes of the light-emitting portions 10-1 through 10-p are commonly connected to the upper electrode 130, and the anodes of the dummy electrodes 20-1 through 20-q are commonly connected to the upper electrode 140. The cathodes of the light-emitting portion 10 and the dummy portion are connected to the lower common electrode 150. The use of multiple dummy portions increases the total area of the active regions in the dummy portion, and improves the resistance to ESD.

Figure 4A:
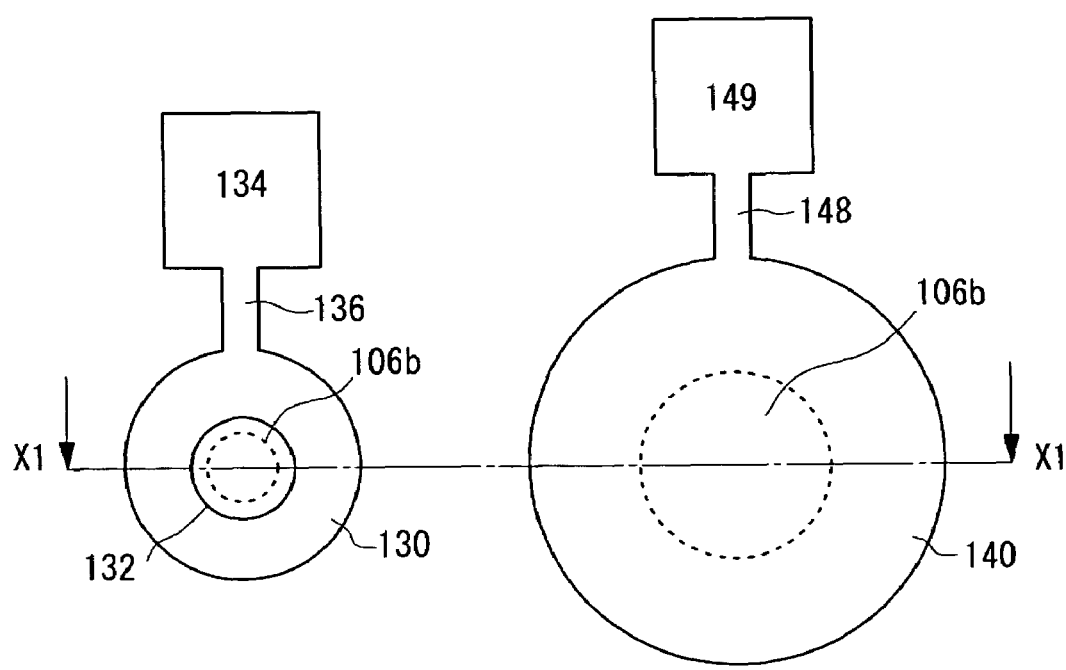
FIG. 4A is a plan view of a VCSEL in accordance with a second embodiment of the present invention.
Figure 4B:
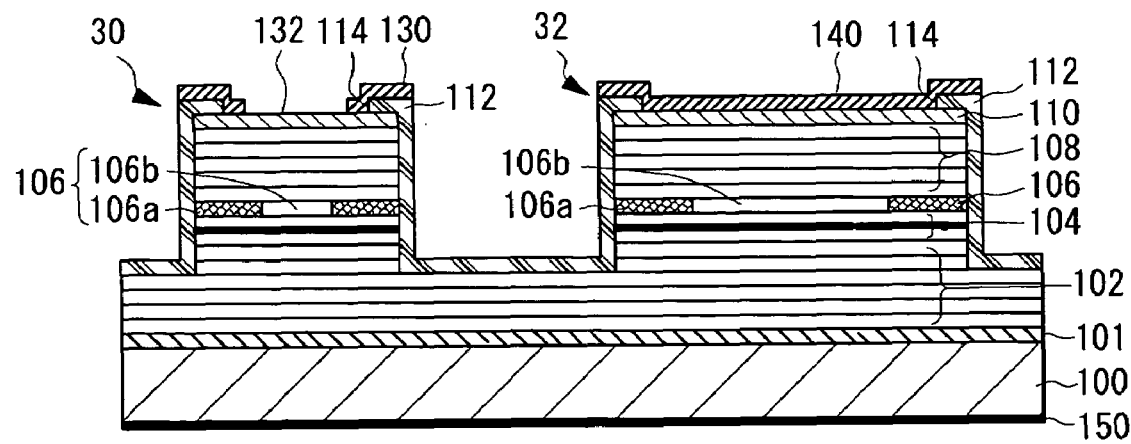
FIG. 4B is a cross-sectional view taken along a line X1-X1 shown in FIG. 4A.

A description will now be given of a VCSEL in accordance with a second embodiment of the present invention. The present VCSEL is of selectively oxidized type. FIG. 4A is a plan view of a VCSEL 2 according to the second embodiment, and FIG. 4B is a cross-sectional view taken along a line X1-X1 shown in FIG. 4A.

The VCSEL 2 has two cylindrical mesas 30 and 32 on the substrate 100. The mesa 30 functions as a light-emitting element of the light-emitting portion 10, and the mesa 32 functions a protection element for the dummy portion 20. The two mesas 30 and 32 may be defined by anisotropically etching a semiconductor layer laminated on the substrate 100. Simultaneously, the mesa structure electrically isolates the light-emitting portion 10 and the dummy portion 20 from each other. The mesa 32 has an outer size greater than that of the mesa 30 so as to have a larger active region, so that the resistance to ESD can be improved.

The mesas 30 and 32 has, on the n-type GaAs substrate 100, an n-type buffer layer 101, an n-type lower DBR (Distributed Bragg Reflector) mirror layer 102, an active layer 104, a p-type AlAs layer 106, a p-type upper DBR mirror 108, and a p-type contact layer 110. These layers are laminated in the above-mentioned order. The active layer 104 may be composed of an undoped lower spacer layer, an undoped quantum well active layer, and an undoped upper spacer layer. The lower DBR mirror layer 102 has may have a multilayer structure composed of n-type $Al_{0.9}Ga_{0.1}As$ layers and n-type $Al_{0.3}Ga_{0.7}As$ layers. Each of the two types of layers may be $\lambda/4n_r$ thick where $\lambda$ is the oscillation wavelength, $n_r$ is the refractive index of a medium. The two types of layers may be alternately laminated one by one by a period of 40.5. The spacer layer located below the active region may be an undoped $Al_{0.6}Ga_{0.4}As$ layer. The quantum well active layer may include an undoped $Al_{0.11}Ga_{0.89}As$ quantum well layer and an undoped $Al_{0.3}Ga_{0.7}As$ barrier layer. The upper spacer layer may be an undoped $Al_{0.6}Ga_{0.4}As$ layer. The upper DBR mirror layer 108 may have a multilayer structure composed of p-type $Al_{0.9}Ga_{0.1}As$ layers and p-type $Al_{0.3}Ga_{0.7}As$ layers. Each of the two types of layers may be $\lambda/4n_r$ thick where $\lambda$ is the oscillation wavelength, $n_r$ is the refractive index of a medium. The two types of layers may be alternately laminated one by one by a period of 30. The p-type contact layer 110 may be a GaAs layer, and may have an impurity concentration of $1\times10^{20}$ $cm^{-3}$. The upper electrodes 130 and 140 may be Au layers or Ti/Au laminates.

The AlAs layer 106 is the lowermost layer of the upper DBR mirror layer 108, and has oxidized regions 106a obtained by partially oxidizing the mesas 30 and 32 from the sides thereof, and circular apertures (electrically conductive regions) 106b surrounded by the oxidized regions 106a. The apertures 106B reflect the outer shapes of the mesas 30 and 32. When the oxidized regions 106a of the mesas 30 and 32 are simultaneously formed, the oxidized distances in the mesas 30 and 32 are equal to each other, so that the area of the aperture 106b of the mesa 32 becomes greater than that of the mesa 30. Thus, the area of the active region of the dummy portion 20 is greater than that of the active region of the light-emitting portion 10. The oxidized region 106a has a high resistance, and a higher refractive index than that of the aperture 106b. Thus, light and current can be confined in the aperture 106b of the mesa 30.

The side and upper surfaces of the mesas 30 and 32 are covered with an interlayer insulating film 112, in which contact holes 114 for exposing the contact layer 110 are formed on the tops of the mesas 30 and 32. In the mesa 30, the upper electrode of the light-emitting portion 10 is in ohmic contact with the contact layer 110 in the contact hole 114. A laser emission window 132 is provided in the center of the upper electrode 130. The upper electrode 130 is connected to a bonding pad 134 via a metal interconnection line 136. The bonding pad 134 is connected to a not-shown lead terminal by a bonding wire. The bonding pad 134 may be formed on the top of the mesa or the bottom thereof.

In the mesa 32, the upper electrode 140 of the dummy portion 20 is in ohmic contact with the contact layer 110 in the contract hole 114. No laser emission window is formed in the upper electrode 140. The upper electrode 140 is connected to a bonding pad 149 via a metal interconnection line 148. The bonding pad 149 is connected to a not-shown lead terminal by a bonding wire. The lead terminal may be connected to, for example, the ground potential. The bonding pad 149 may be provided on the top of the mesa or the bottom thereof.

The VCSEL 2 is driven by applying a forward voltage between the upper electrode 130 of the light-emitting portion 10 and the n-side lower common electrode 150, so that current is injected to the mesa 30. In a case where a static charge is applied to the lower common electrode 150, if the static charge is a negative voltage, that is, a forward voltage, current flows through the active region of the dummy portion 20 (mesa 32) from the upper electrode 140 of the mesa 32, that is, the ground potential to the lower common electrode 150. In contrast, if the static charge is a reverse bias voltage, current flow through the active region of the dummy portion 20 of the mesa 32 from the lower common electrode 150 to the upper electrode 140 of the dummy portion 20 because the pn junction of the dummy portion 20 has a lower breakdown voltage than that of the pn junction of the light-emitting portion 10. The impurity concentrations of the p-type and n-type semiconductor layers may be adjusted as necessary in order to reduce the breakdown voltage in the dummy portion 20. An electrostatic discharge that occurs on the top of the chip is captured by the upper electrode 140 of the dummy portion 20 having the larger area, and flows to the ground potential 149.

According to the present embodiment, the multiple mesas are formed on the substrate, and at least one of the mesas is used as the protection element for ESD. Thus, as compared to the conventional structure in which the diode is connected to the VCSEL, the device may be easily fabricated at reduced cost.

The second embodiment has two cylindrical mesas 30 and 32. The shapes and arrangements of the mesas 30 and 32 may be arbitrarily modified. For example, the mesa for light emission may be arranged in the center, and multiple dummy mesas may be arranged around the light-emission mesa. In this case, the multiple dummy mesas may be made higher than the light-emission mesa so that electrostatic discharge may be captured more easily.

Figure 5:
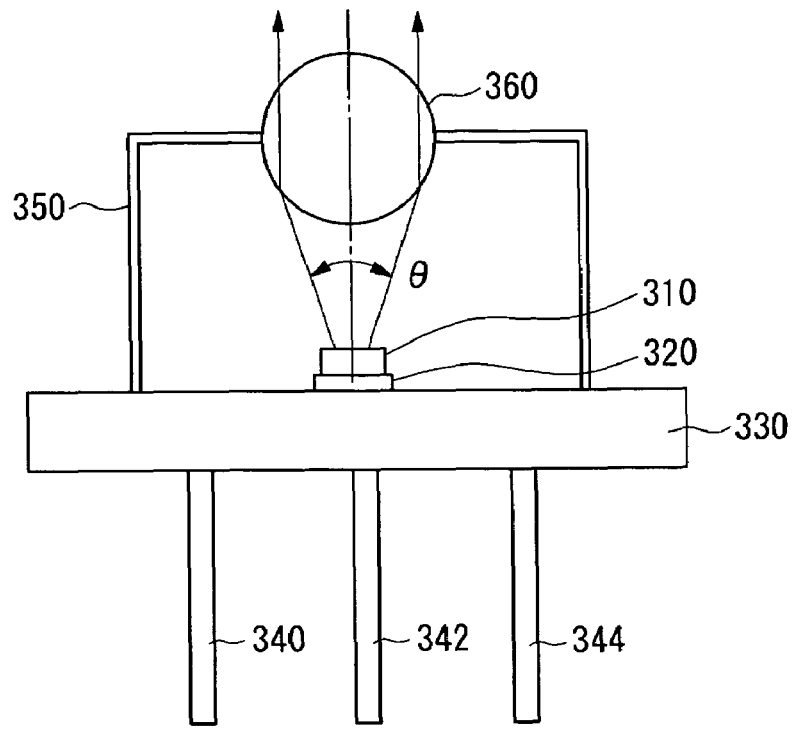
FIG. 5 schematically shows a package in which a VCSEL chip is housed.

FIG. 5 is a cross-sectional view of a package in which a VCSEL chip of the present invention is housed. A package 300 houses a VCSEL chip 310, which is fixed to a disc-shaped metal stem 330 through an electrically conductive adhesive 320. Electrically conductive leads 340, 342 and 344 are inserted into through holes (not shown) formed in the stem 330. The lead 340 is electrically connected to the n-side electrode (the lower common electrode 150 shown in FIG. 1B) provided on the backside of the chip 310. The lead 342 is electrically connected to the p-side electrode (the bonding pad 134 connected to the upper electrode 130 in the light-emitting portion 10 in FIGS. 1A and 1B) via a bonding wire or the like. The lead 344 is electrically connected to the upper electrode 140 of the dummy portion 20 or the bonding pad 149 thereof via a bonding wire or the like. The lead 344 is not essentially needed but may be replaced for a metal plate having a given capacitance.

A rectangular hollow cap 350 is fixed to the stem 330 including the chip 310, and a ball lens 360 is fixed to an opening provided in the center of the cap 350. The optical axis of the ball lens 360 is positioned so as to be aligned with the center of an array of the chip 310. A forward voltage is applied between the leads 340 and 342, laser lights are emitted from mesas arrayed on the chip 310. The distance between the chip 310 and the ball lens 360 is adjusted so that the ball lens 360 is included within an emission angle θ of the laser lights from the chip 310. A light-receiving element for monitoring the light-emitting performance of the VCSEL may be included in the cap 350.

Figure 6:
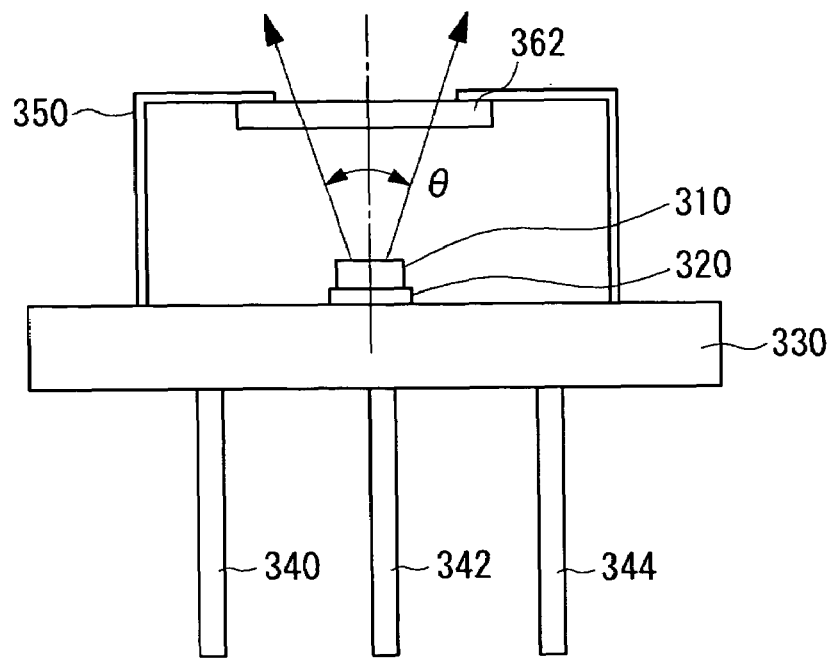
FIG. 6 schematically shows another package in which a VCSEL chip is housed.
Figure 7:
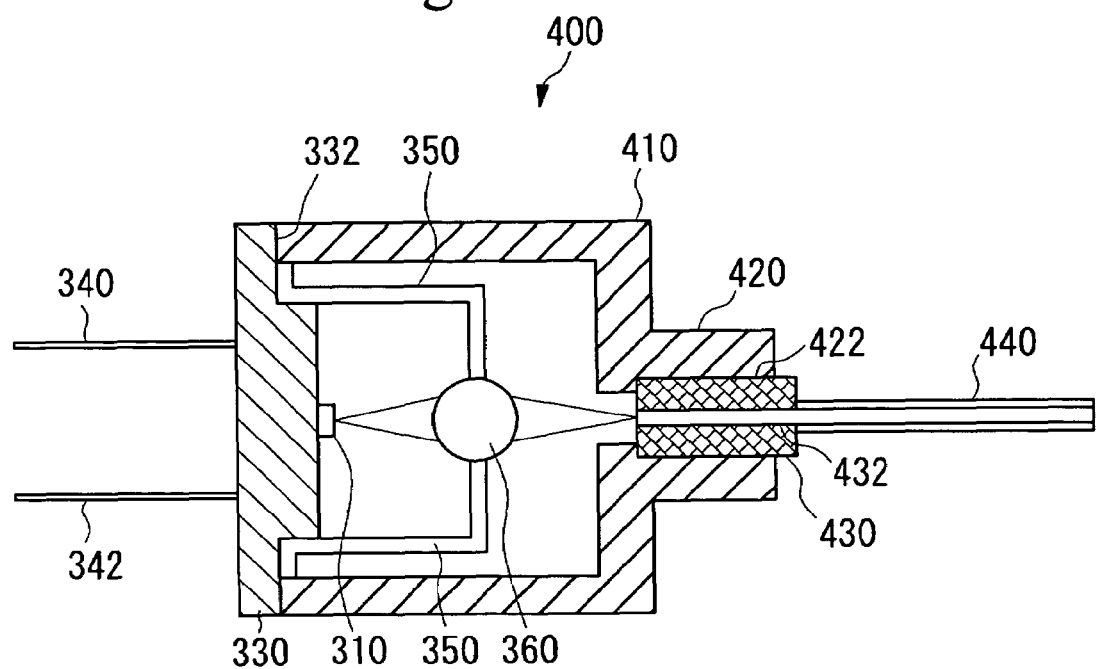
FIG. 7 is a cross-sectional view of an optical transmission system equipped with the package shown in FIG. 5.

FIG. 6 is a cross-sectional view of an optical transmission apparatus to which the package or module shown in FIG. 5 is applied. An optical transmission apparatus 400 includes a housing 410, a sleeve 420, a ferrule 430 and an optical fiber 440. The housing 410 is fixed to the step 330. The sleeve 420 is integrally formed with an end surface of the housing 410. The ferrule 430 is held in an opening 422 of the sleeve 420. The optical fiber 440 is held by the ferrule 430. An end of the housing 410 is fixed to a flange 332 formed in the circumferential direction of the step 330. The ferrule 430 is precisely positioned to the opening 422 of the sleeve 420, and optical axis of the optical fiber 440 is aligned with the optical axis of the ball lens 360. The core line of the optical fiber 440 is held in a through hole 432 of the ferrule 430.

The laser light emitted from the surface of the chip 310 is condensed by the ball lens 360, and the condensed light is incident to the core line of the optical fiber 440 for transmission. The ball lens 360 may be replaced by a double-convex lens, a flat-convex lens or another lens. The optical transmission apparatus 400 may include a drive circuit that processes the electric signal applied between the leads 340 and 342. The optical transmission apparatus 400 may have the function of receiving an optical signal transmitted over the optical fiber 440.

Figure 8:
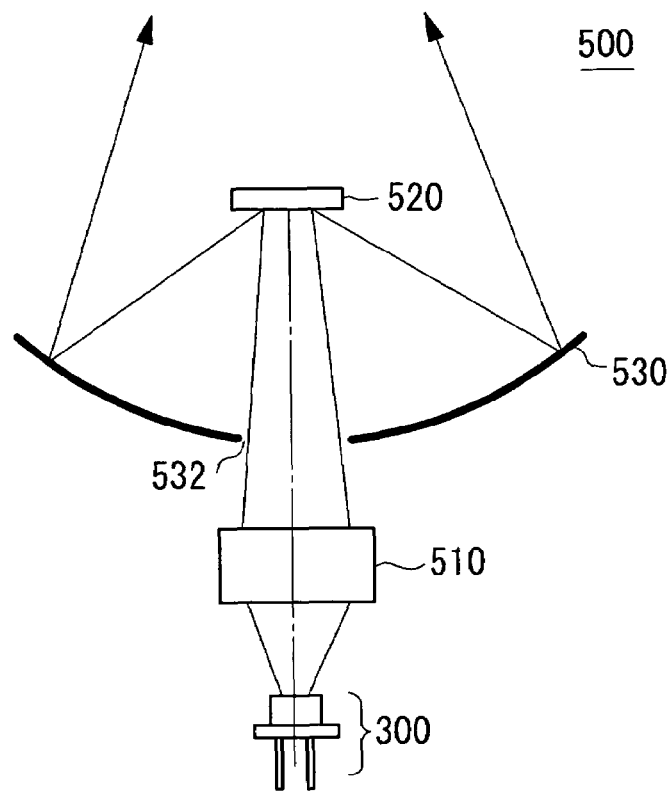
FIG. 8 shows a free space transmission system to which the package shown in FIG. 6 is applied.

FIG. 8 shows a structure in which the package shown in FIG. 6 is applied to a free space optical transmission system. A free space optical transmission system 500 includes the package 300, a condense lens 510, a diffusion plate 520 and a reflection mirror 530. The light condensed by the condense lens 510 is reflected by the diffusion plate 520 via an opening 532 of the reflection mirror 530, and goes towards the reflection mirror 520. The reflection mirror 520 reflects the incident light in a given direction for optical transmission.

Figure 9:
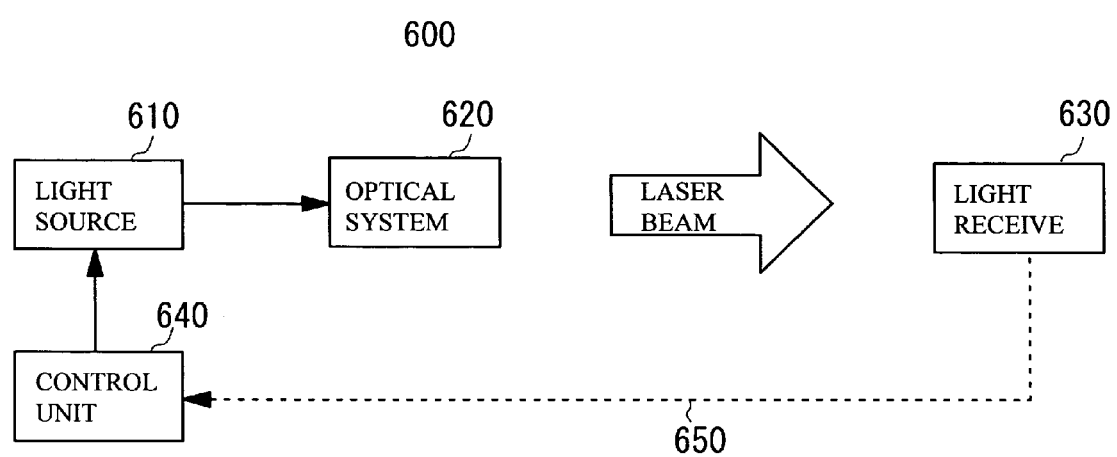
FIG. 9 is a block diagram of an optical transmission system in which the VCSEL of the present invention is employed as a light source.

FIG. 9 shows an optical transmission system to which the VCSEL array is applied. An optical transmission system 600 includes a light source 620, an optical system 620, a light-receiving unit 630, and a control unit 640. The light source 610 includes the chip 310 on which the VCSEL array is formed. The optical system 620 condenses the laser beam emitted from the light source 610. The light-receiving unit 630 receives the laser beam output from the optical system 620. The control unit 640 controls driving the light source 610. The control unit 640 supplies the light source 610 with a drive pulse signal for driving the VCSEL array. The light emitted from the light source 610 is guided to the light-receiving unit 630 via the optical system 620 by an optical fiber and a reflection mirror for free space optical transmission. The light-receiving unit 630 detects the received light by a photodetector or the like. The light-receiving unit 630 can control the operation (for example, the start timing of optical transmission) of the control unit 640 in response to a control signal 650.

Figure 10:
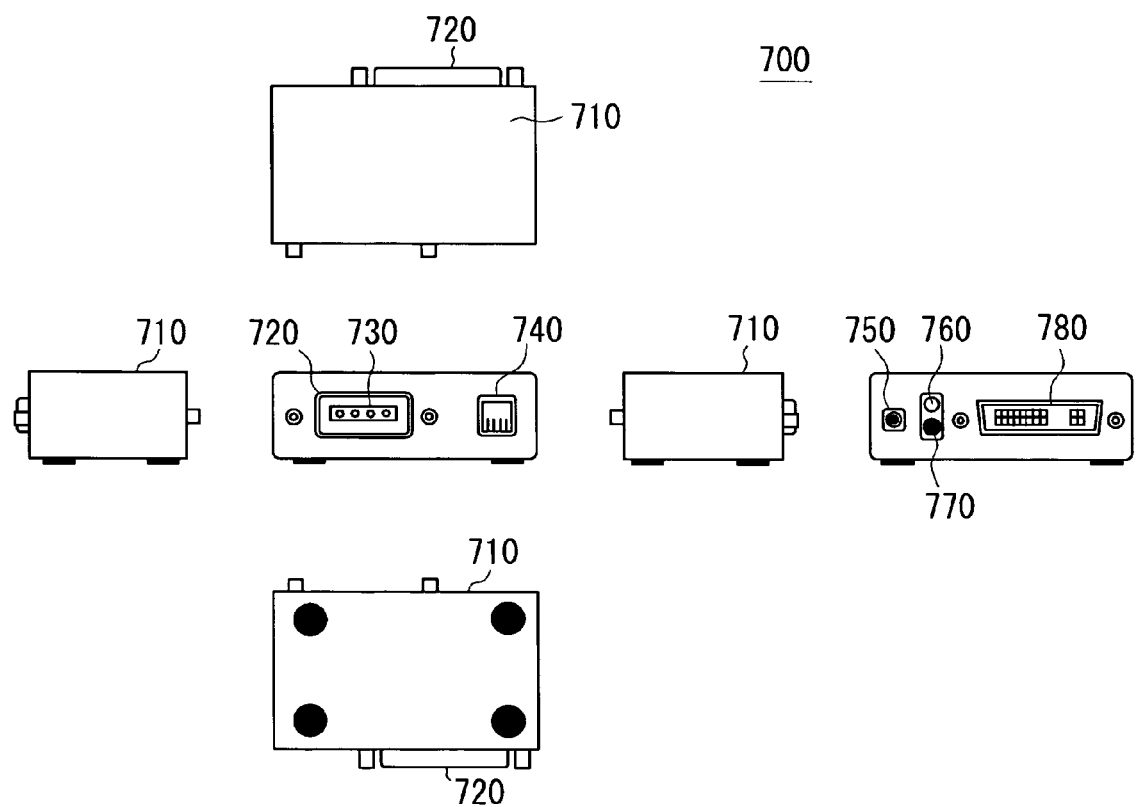
FIG. 10 shows outer appearances of an optical transmission apparatus.
Figure 11A:
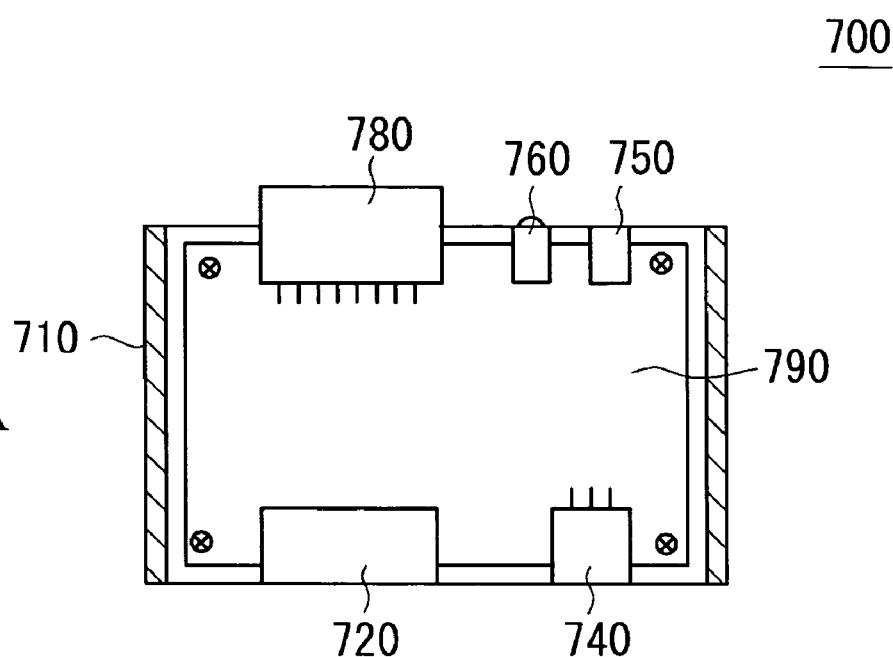
FIG. 11A shows an inner structure of the optical transmission apparatus.
Figure 11B:
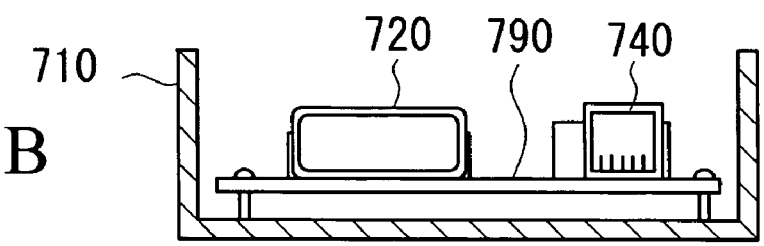
FIG. 11B shows the inner structure of the optical transmission system in which a side wall of the apparatus is removed.

A description will now be given of an optical transmission apparatus used for the optical transmission system. FIG. 10 shows the outer appearance of the optical transmission apparatus, and FIGS. 11A and 11B show an internal structure thereof. An optical transmission apparatus 700 includes a casing 710, an optical signal transmission/reception connector joint unit 720, a light-emitting/light-receiving element 730, an electric signal cable joint unit 740, a power input unit 750, an LED 760 indicative of in-operation, an LED 770 indicative of error, a DVI connector 780 and a transmission circuit board/reception circuit board 790.

Figure 12:
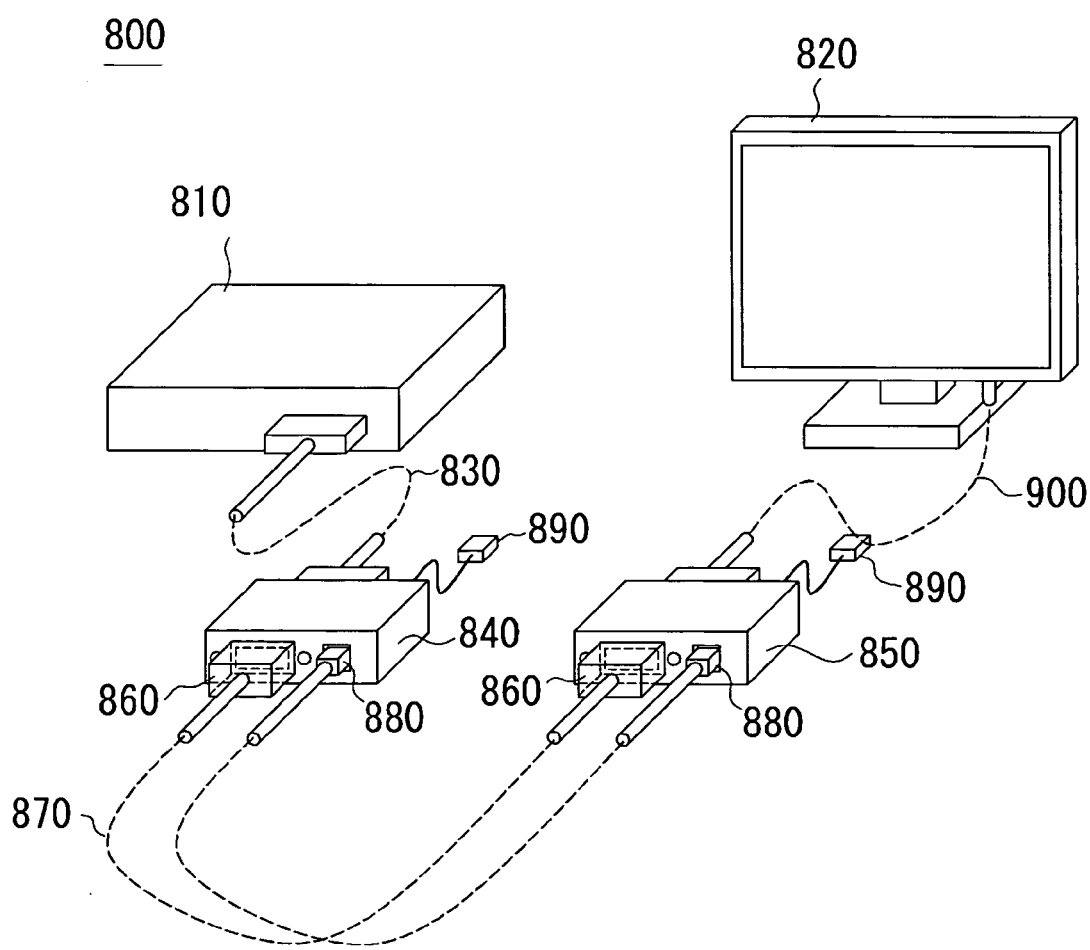
FIG. 12 shows a video transmission system to which the optical transmission system shown in FIG. 10 is applied.
Figure 13:
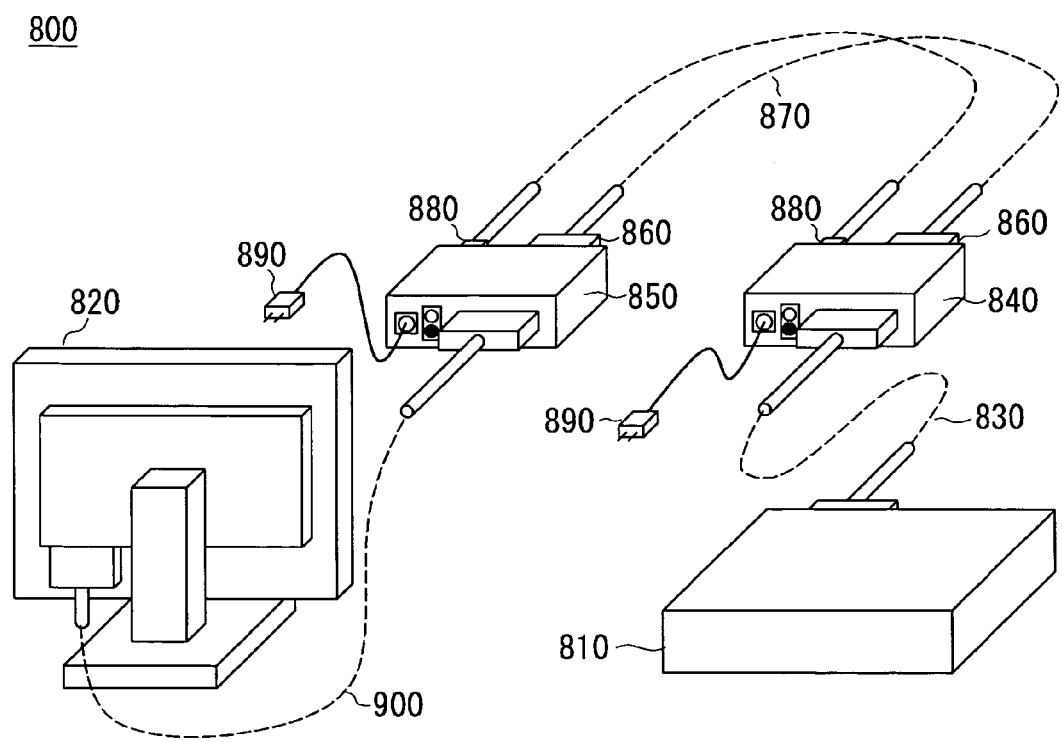
FIG. 13 shows the video transmission system viewed from the backside shown in FIG. 12.

A video transmission system equipped with the optical transmission apparatus 700 is illustrated in FIGS. 12 and 13. Referring to these figures, a video transmission system 800 is equipped with the optical transmission apparatus shown in FIG. 10 for transmitting a video signal generated by a video signal generator 810 to an image display device 820 such as a liquid crystal display. The video transmission system 800 includes the video signal generator 810, the image display device 820, a DVI electrical cable 830, a transmission module 840, a reception module 850, an optical connector for video signal transmission, an optical fiber 870, an electrical cable connector 880 for use in control, a power adapter 890, and a DVI electrical cable 900.

In the above video transmission system, electric signals are used for transmission between the video signal generator 810 and the transmission module 840, and transmission between the reception module 850 and the video display device 820 by electrical cables 830 and 900. Instead of the electrical cables, optical transmission may be employed. For example, signal transmission cables having connectors equipped with an electro-optical converter and an opto-electrical converter may be substituted for the electrical cables 830 and 900.

Finally, various aspects of the present invention are summarized in the following.

According to an aspect of the present invention, a surface emitting semiconductor laser includes: a substrate; at least one light-emitting element on the substrate; and at least one protection element on the substrate, the light-emitting element including a first semiconductor layer of a first conduction type electrically connected to a first electrode, and a second semiconductor layer of a second conduction type electrically connected to a second electrode, the protection element including a third semiconductor layer of the first conduction type electrically connected to a third electrode, and a fourth semiconductor layer of the second conduction type electrically connected to the second electrode, the first semiconductor layer and the first electrode being electrically isolated from the third semiconductor layer and the third electrode by insulation means.

The surface-emitting semiconductor laser may be configured so that: the first conduction type is a p type, and the second conduction type is an n type; the first electrode is an anode of the light-emitting element, and the second electrode is a cathode thereof; and the third electrode is connected to a reference potential.

The surface-emitting semiconductor laser may be configured so that: the first and second semiconductor layers are laminated on the substrate; the third and fourth semiconductor layers are laminated on the substrate; the first electrode is provided on a top of the first semiconductor layer, and the third electrode is provided on a top of the third semiconductor layer; and the second electrode is provided below the second and fourth semiconductor layers.

The surface-emitting semiconductor laser may be configured so that the insulation means includes a trench or gap.

The surface-emitting semiconductor laser may be configured so that the insulation means a high-resistance region.

The surface-emitting semiconductor laser may be configured so that the third electrode has an area greater than that of the first electrode.

The surface-emitting semiconductor laser may be configured so that: the light-emitting element includes a current confinement region between the first and second semiconductor layers; and the protection element includes another current confinement region between the third and fourth semiconductor layers.

The surface-emitting semiconductor laser may be configured so that the current confinement regions include oxidized layers defined by selectively oxidizing parts of the first and third semiconductor layers.

The surface-emitting semiconductor laser may be configured so that the light-emitting element and the protection element include active layers close to the current confinement regions.

The surface-emitting semiconductor laser may be configured so that the active region defined by the current confinement region of the protection element has an area greater than that of the active region defined by the current confinement region of the light-emitting element.

The surface-emitting semiconductor laser may be configured so that the first and third semiconductor layers include semiconductor multilayer reflection films.

The surface-emitting semiconductor laser may be configured so that a breakdown voltage associated with a reverse bias of the protection element is lower than that associated with a reverse bias of the light-emitting element.

The surface-emitting semiconductor laser may be configured so that: the light-emitting element has at least one mesa formed on the substrate; the first electrode is electrically connected to the first semiconductor layer on the top of the at least one mesa; and the first electrode has an aperture through which laser light is emitted from the to of the at least one mesa.

The surface-emitting semiconductor laser may be configured so that the first electrode includes a bonding pad.

The surface-emitting semiconductor laser may be configured so that the third electrode includes a bonding pad.

The surface-emitting semiconductor laser may be configured so that the third electrode is connected to a ground potential.

According to the present invention, the insulation means insulates the first semiconductor layer and the first electrode of the light-emitting element from the third semiconductor laser and the third electrode of the protection element. Thus, an appropriate amount of driving current can flow in the normal operation of the light-emitting element. This restrains the electrostatic capacitance of the light-emitting element and restrain degradation of high-frequency responsiveness of the light-emitting element. When electric static discharge current or serge current is applied to the second electrode, these currents are caused to mainly flow to the third electrode through the protection element, so that the light-emitting element can be protected from the currents. When the area of the third electrode is made greater than that of the first electrode, electrostatic discharge that takes place on the chip surface may easily be captured by the third electrode on the chip surface. In this manner, unwanted current can be escaped to the third electrode, which may be at a reference potential. The surface-emitting semiconductor laser thus configured has improved resistance to ESD. According to an aspect of the present invention, a dummy VCSEL is used as a protection element. The dummy VCSEL protection element may easily be fabricated at low cost as compared to the conventional protection elements.

The present invention is not limited to the specifically described embodiments, and variations and modifications may be made without departing from the scope of the claimed invention.

The present invention is based on Japanese Patent Application No. 2005-179402 filed on Jun. 20, 2005, the entire disclosure of which is hereby incorporated by reference.

What is claimed is:

1. A surface emitting semiconductor laser comprising:
a substrate;
at least one light-emitting element on the substrate; and
at least one protection element on the substrate,
the light-emitting element including a first semiconductor layer of a first conduction type electrically connected to a first electrode, and a second semiconductor layer of a second conduction type electrically connected to a second electrode,
the protection element including a third semiconductor layer of the first conduction type electrically connected to a third electrode, and a fourth semiconductor layer of the second conduction type electrically connected to the second electrode,
the first semiconductor layer and the first electrode being electrically isolated from the third semiconductor layer and the third electrode by insulation means.

2. The surface-emitting semiconductor laser according to claim 1, wherein:
the first conduction type is a p type, and the second conduction type is an n type;
the first electrode is an anode of the light-emitting element, and the second electrode is a cathode thereof; and
the third electrode is connected to a reference potential.

3. The surface-emitting semiconductor laser according to claim 1, wherein:
the first and second semiconductor layers are laminated on the substrate;
the third and fourth semiconductor layers are laminated on the substrate;
the first electrode is provided on a top of the first semiconductor layer, and the third electrode is provided on a top of the third semiconductor layer; and
the second electrode is provided below the second and fourth semiconductor layers.

4. The surface-emitting semiconductor laser according to claim 1, wherein the insulation means includes a trench or gap.

5. The surface-emitting semiconductor laser according to claim 1, wherein the insulation means a high-resistance region.

6. The surface-emitting semiconductor laser according to claim 1, wherein the third electrode has an area greater than that of the first electrode.

7. The surface-emitting semiconductor laser according to claim 1, wherein:
the light-emitting element includes a current confinement region between the first and second semiconductor layers; and
the protection element includes another current confinement region between the third and fourth semiconductor layers.

8. The surface-emitting semiconductor laser according to claim 7, wherein the current confinement regions include oxidized layers defined by selectively oxidizing parts of the first and third semiconductor layers.

9. The surface-emitting semiconductor laser according to claim 7, wherein the light-emitting element and the protection element include active layers close to the current confinement regions.

10. The surface-emitting semiconductor laser according to claim 9, wherein the active region defined by the current confinement region of the protection element has an area greater than that of the active region defined by the current confinement region of the light-emitting element.

11. The surface-emitting semiconductor laser according to claim 1, wherein the first and third semiconductor layers include semiconductor multilayer reflection films.

12. The surface-emitting semiconductor laser according to claim 1, wherein a breakdown voltage associated with a reverse bias of the protection element is lower than that associated with a reverse bias of the light-emitting element.

13. The surface-emitting semiconductor laser according to claim 1, wherein:
the light-emitting element has at least one mesa formed on the substrate;
the first electrode is electrically connected to the first semiconductor layer on the top of the at least one mesa; and
the first electrode has an aperture through which laser light is emitted from the to of the at least one mesa.

14. The surface-emitting semiconductor laser according to claim 1, wherein the first electrode includes a bonding pad.

15. The surface-emitting semiconductor laser according to claim 1, wherein the third electrode includes a bonding pad.

16. The surface-emitting semiconductor laser according to claim 1, wherein the third electrode is connected to a ground potential.

17. A module comprising:
a surface-emitting semiconductor laser and a package housing the surface-emitting semiconductor laser;
the surface-emitting semiconductor laser including:
a substrate;
at least one light-emitting element on the substrate; and
at least one protection element on the substrate,
the light-emitting element including a first semiconductor layer of a first conduction type electrically connected to a first electrode, and a second semiconductor layer of a second conduction type electrically connected to a second electrode,
the protection element including a third semiconductor layer of the first conduction type electrically connected to a third electrode, and a fourth semiconductor layer of the second conduction type electrically connected to the second electrode,
the first semiconductor layer and the first electrode being electrically isolated from the third semiconductor layer and the third electrode by insulation means.

18. An optical communication apparatus comprising:
a surface-emitting semiconductor laser;
a package housing the surface-emitting semiconductor laser; and
a transmission unit transmitting laser light emitted from the surface emitting semiconductor laser,
the surface emitting semiconductor laser including:
a substrate;
at least one light-emitting element on the substrate; and
at least one protection element on the substrate,
the light-emitting element including a first semiconductor layer of a first conduction type electrically connected to a first electrode, and a second semiconductor layer of a second conduction type electrically connected to a second electrode, the protection element including a third semiconductor layer of the first conduction type electrically connected to a third electrode, and a fourth semiconductor layer of the second conduction type electrically connected to the second electrode, the first semiconductor layer and the first electrode being electrically isolated from the third semiconductor layer and the third electrode by insulation means.

19. optical communication system comprising:

a surface-emitting semiconductor laser;

a package housing the surface-emitting semiconductor laser; and a transmission unit transmitting laser light emitted from the surface emitting semiconductor laser, the surface emitting semiconductor laser including:

a substrate;

at least one light-emitting element on the substrate; and at least one protection element on the substrate, the light-emitting element including a first semiconductor layer of a first conduction type electrically connected to a first electrode, and a second semiconductor layer of a second conduction type electrically connected to a second electrode, the protection element including a third semiconductor layer of the first conduction type electrically connected to a third electrode, and a fourth semiconductor layer of the second conduction type electrically connected to the second electrode, the first semiconductor layer and the first electrode being electrically isolated from the third semiconductor layer and the third electrode by insulation means.

* * * * *